INVENTORS.
JOHN W. CANNON
JOHN WORKINGS
By Mason, Kolehmainen, Rathburn & Wyss Attys.

INVENTORS:
JOHN W. CANNON
JOHN WORKINGS
By Mason, Kolehmainen, Rathburn & Wyss
Attys.

United States Patent Office 3,373,406
Patented Mar. 12, 1968

3,373,406

LOGIC CIRCUIT BOARD MATRIX HAVING DIODE AND RESISTOR CROSSPOINTS

John W. Cannon, Los Angeles, and John Workings, Torrance, Calif., assignors to The Scam Instrument Corporation, Skokie, Ill., a corporation of Illinois Filed Dec. 4, 1963, Ser. No. 328,034
5 Claims. (Cl. 340—166)

ABSTRACT OF THE DISCLOSURE

A logic circuit board includes a series of input wires suspended over a first surface of the board, and a series of output wires are suspended over a second surface and extend transversely of the input wires. Logic diodes extend through holes in the board and are connected between input and output wires at selected crossing points. A power bus, connected to the positive side of a power supply, is supported on the first surface of the board and is connected to supply a positive potential to each output wire by resistors extending through the board. The input wires are connected to the outputs of bistable circuits effective to ground selected input wires in response to external control. When an input wire is grounded, selected output wires are grounded through the logic diodes to produce an output signal that is applied to output terminals through isolating diodes, also extending through the board.

This invention relates to logic circuits and particularly to the physical construction and arrangement of components making up a logic circuit system comprising a large number of "and" logic circuits.

Heretofore, the construction of "and" and "or" logic circuits utilized a chassis made of metal or insulating material upon which electrical components such as resistors, rectifiers, etc. were supported either directly upon the chassis or on separate plug-in units or subassemblies removably mounted on the chassis and over which extends various circuit connections in the form of printed circuit paths or other conductors interconnecting the components.

Among the primary objects of the invention are to simplify materially the fabrication of multiple "and" logic circuit apparatus substantially to reduce the manufacturing costs and space requirements thereof.

The present invention, in part, makes use in the fabrication of mutiple "and" logic circuit systems of support chassis arrangements heretofore applied only in such nonanalogous applications as decoding matrices and the like. Moreover, it utilizes substantial modifications of the chassis constructions and component arrangements heretofore used for decoding matrices and the like to provide marked advantages when applied to multiple "and" logic circuit systems.

In accordance with the most advantageous form of the invention, a complex multiple "and" logic circuit system is constructed with a board made of insulating material positioned between a set of parallel taut signal input wires extending in spaced contiguous relation to one of the sides of the board and a set of parallel taut output wires extending at right angles to the signal input wires and positioned in spaced contiguous relation to the other side of the board. The board is provided with holes at certain preselected crossover points between the orthogonally related wires in accordance with the basic "and" circuit logic involved, so that the physical layout of the holes correspond to the rectangular grid circuit diagram of the logic circuit system involved. The signal input wires may, for example, be connected to respective outputs of a number of condition responsive bistable circuits each of which produces an output potential depending upon the condition of the bistable circuit, and the signal output wires on the opposite side of the board are connected to logic circuit components which may, for example, be the set or reset terminals of the aforementioned bistable circuits or to other logic circuit components.

Interconnections are made between the signal output and input wires on opposite sides of the board at the aforementioned crossover points by rectifiers which are placed within the holes in the board and welded to the respective wires at their crossover points. Isolating rectifiers and individual gate resistors are also preferably mounted within separate holes in the board aligned with the signal output wires. The rectifiers and associated resistors are welded to the signal output wires where they cross the latter holes. The logic circuit system is completed by connecting the output sides of the isolating rectifiers to signal output terminals mounted on the board and connecting a source of direct current voltage to a common power wire stretched over the board in alignment with the aforesaid resistors and welded to terminals of the resistors. The spacing of the signal input and signal output wires form the board prevents damage to the rectifiers and the board during the welding operation.

One of the most important advantages of the invention is that it makes possible the direct coordinate translation from logic equations to a physical layout so that unskilled workers can interpret and wire the board. The construction of the logic circuit of the invention board requires merely the dropping of resistors and rectifiers in the board holes and then connecting the leads thereof to the adjacent wires. Also, fewer connections are required by the present invention and extremely rugged equipment results when welded, as distinguished from soldered, connections are used (only soldering would be feasible if the wires were laid on the board). Perhaps the most important advantage of the invention is that the resultant apparatus occupies as little as one-sixth of the space occupied by an identical logic circuit system made in the conventional way.

Other objects, advantages and features of the invention will become apparent upon making reference to the specification to follow, the claims and the drawings:

Figure 1:
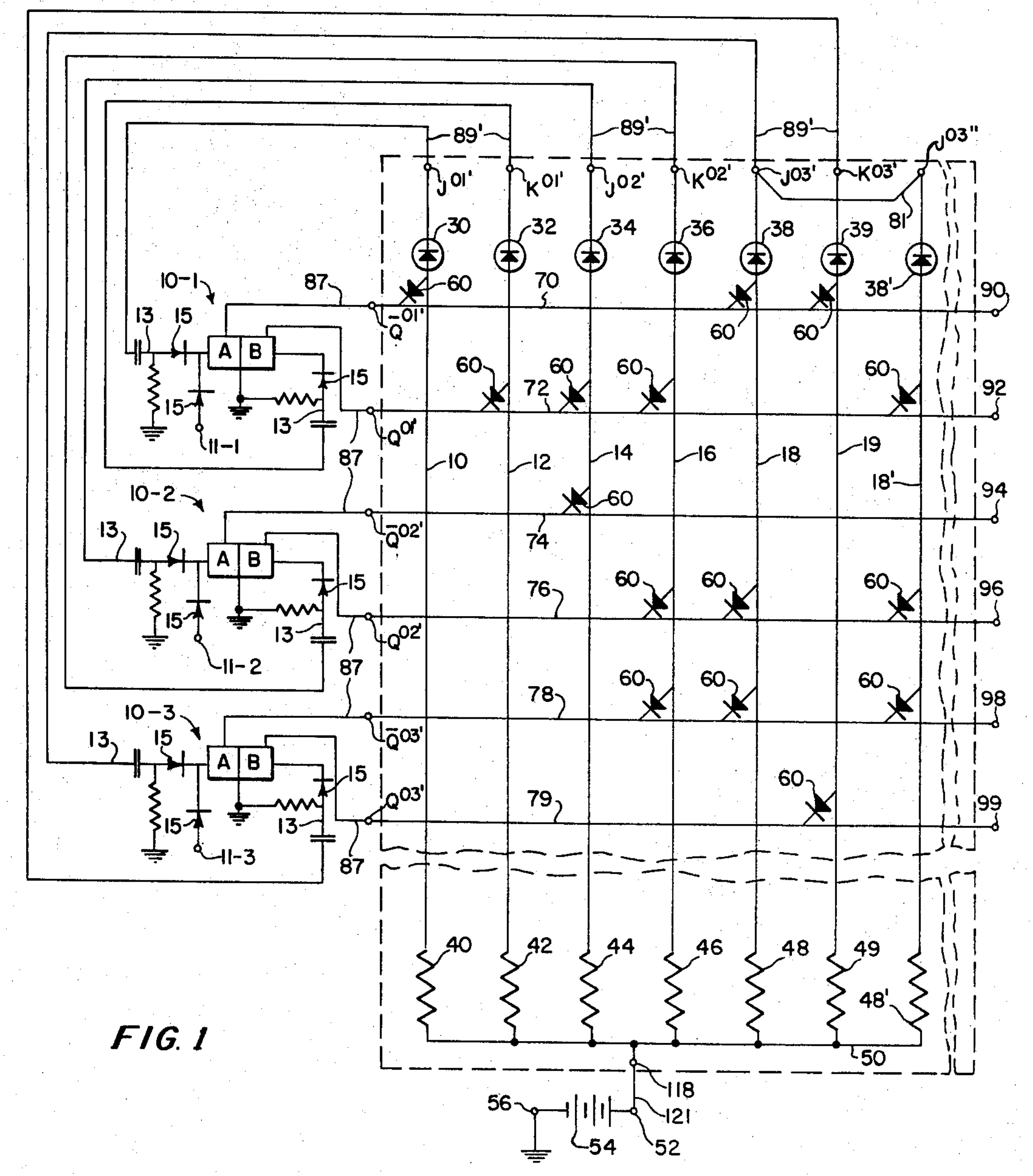
FIG. 1 is a rectangular grid type circuit diagram of an exemplary multiple "and" and "or" logic circuit system to which the present invention will be applied in the exemplary form thereof illustrated in the other figures of the drawing.

Refer now to FIG. 1 which illustrates an exemplary multiple "and" or "or" logic circuit system to which the present invention is applied in the apparatus shown in FIGS. 2–5. This logic circuit system comprises seven "and" logic circuits with two of the "and" logic circuits being interconnected to form an "or" logic circuit, these circuits being illustrated in the following equations:

(1) $J^{01'}=\bar{Q}^{01}$
(2) $K^{01'}=Q^{01}$ (3) $J^{02'}=Q^{01}\bar{Q}^{02}$ (4) $K^{02'}=Q^{01}Q^{02}\bar{Q}^{03}$ (5) $J^{03'}=\bar{Q}^{01}Q^{02}\bar{Q}^{03}+Q^{01}Q^{02}\bar{Q}^{03}$ (6) $K^{03'}=\bar{Q}^{01}Q^{03}$ The logic circuits have seven signal output terminals identified respectively by reference characters $J^{01'}$, $K^{01'}$, $J^{02'}$, $J^{03'}$, $J^{03''}$ and $K^{03'}$ and a number signal input terminals respectively identified by reference characters $\bar{Q}^{01'}$, $Q^{01'}$, $\bar{Q}^{02'}$, $Q^{02'}$, $\bar{Q}^{03'}$ and $Q^{03'}$. A typical logic circuit system would include a much larger number of "and" circuits than that shown in FIG. 1, and so the circuit shown in FIG. 1 includes fragmentation lines to indicate that additional signal input and output terminals and associated logic circuits would be present in a typical system.

The signals fed to the signal input terminals are illustrated as being the corespondingly identified outputs of bistable circuits generally designated as 10–1, 10–2 and 10–3. As is common in bistable circuit design, each bistable circuit indicates a pair of cross-connected current controlled devices A and B diagrammatically illustrated which devices may be transistors or the like, which are either in conductive or non-conductive conditions. The $\bar{Q}$ output of each bistable circuit is taken at the load terminal of one of the current control devices A, and the Q output is taken at the load terminal of the other current control device B. It will be assumed that in one of the two possible states of the bistable circuit, to be referred to as the set state, the A current control device will be in a non-conductive condition while the B current control device will be a conductive condition. In the other state of the bistable circuit, to be referred to as the reset state, the current control device will be in a conductive condition and the B current control device will be in a non-conductive condition. The bistable circuits each have set and reset input terminals for setting and resetting the same. In the non-conductive condition of the current control devices, the output voltage thereof may be a positive voltage and in the conductive condition thereof the output voltage thereof will be at ground. Although the signal output terminals $J^{01'}$, $K^{01'}$, etc. may extend to other circuit units instead of the bistable circuits 10–1, 10–2 and 10–3, the circuit logic illustrated interconnects the set and reset terminals of the various bistable circuits through isolating rectifiers 15 to the correspondingly identified signal output terminals of the "and" logic circuit system so as to be controlled in part thereby. These connections may be direct connections in some cases but they are illustrated as being through differentiating circuits 13 which couple the control voltages involved only during a change in voltage on the signal output terminals. The bistable circuits can also be set from signals on external control terminals 11–1, 11–2 and 11–3. It will be assumed that when a positive voltage is fed to a set terminal of any bistable circuit that it will be triggered to its set state and when a positive voltage is fed to the reset terminal thereof the bistable circuit will be triggered to its reset state.

The "and" logic circuits associated with the aforementioned signal output terminals have respective signal output lines 10, 12, 14, 16, 18, 18' and 19. Isolating rectifiers 30, 32, 34, 36, 38, 38' and 39 are respectively connected between the associated signal output terminals and these signal output lines. The isolating rectifiers are arranged so that their anode electrodes are connected respectively to their associated signal output lines 10, 12, etc. Resistors 40, 42, 44, 46, 48, 48' and 49 are respectively connected between the signal output lines 10, 12, 14, 16, 18 and 19 and a common power line 50. A positive terminal 52 of a source of direct current voltage 54 is connected to the common power line 50, the negative terminal 56 thereof being grounded. The seven logic circuits include one of more logic circuit forming rectifiers 60 extending between the associated signal output line and one or more input lines 70, 72, 74, 76, 78 and 79, respectively connected to the aforementioned signal input terminals $\bar{Q}^{01'}$, $Q^{01'}$, $\bar{Q}^{02'}$, $Q^{02'}$, $\bar{Q}^{03'}$ and $Q^{03'}$. The "and" logic circuit forming rectifiers 60 are arranged so that their anode electrodes are connected to their associated signal output lines. As illustrated, rectifiers 60 are connected between signal output line 10 and the signal input line 70, between signal output line 12 and signal input line 72, between signal output line 14 and signal input lines 72 and 74, between signal output line 16 and signal input lines 72 and 76, between signal output line 18 and signal input lines 70, 76 and 78, between signal output line 18' and signal input lines 72, 76 and 78 and between signal output line 19 and signal input lines 70 and 79. A conductor 81 is connected between the signal output terminals $J^{03''}$ and $J^{03'}$ to form the "or" logic represented by Equation #5.

The operation of each of the "and" logic circuits can be explained by stating that there will be a positive voltage at the signal output terminal of the "and" logic circuit involved so long as all of the "and" logic circuit forming rectifiers 60 thereof are receiving a position voltage on their associated input lines, and this condition will allow current to flow through the associated rectifiers 30, 32, etc. Voltage at the positive terminal 52 of the source of direct current voltage 54 will be coupled through the associated resistor and isolating rectifier involved to the associated signal output terminal. (This presupposes that the signal output terminal is connected eventually through a resistor (not shown) to ground.) No signal will be present at any of these signal output terminals if any one of the associated logic circuit forming rectifiers 60 is connected to an input line which is at a ground since, in such case all of the current flowing from the source of direct current voltage 54 through the resistor (40–49) will be carried through the rectifier 60 to a low impedance source, thus decoupling current from the positive terminal 52 of the source of direct current voltage 54 from flowing through the isolating rectifier involved.

Figures 2, 3, 4, 5:
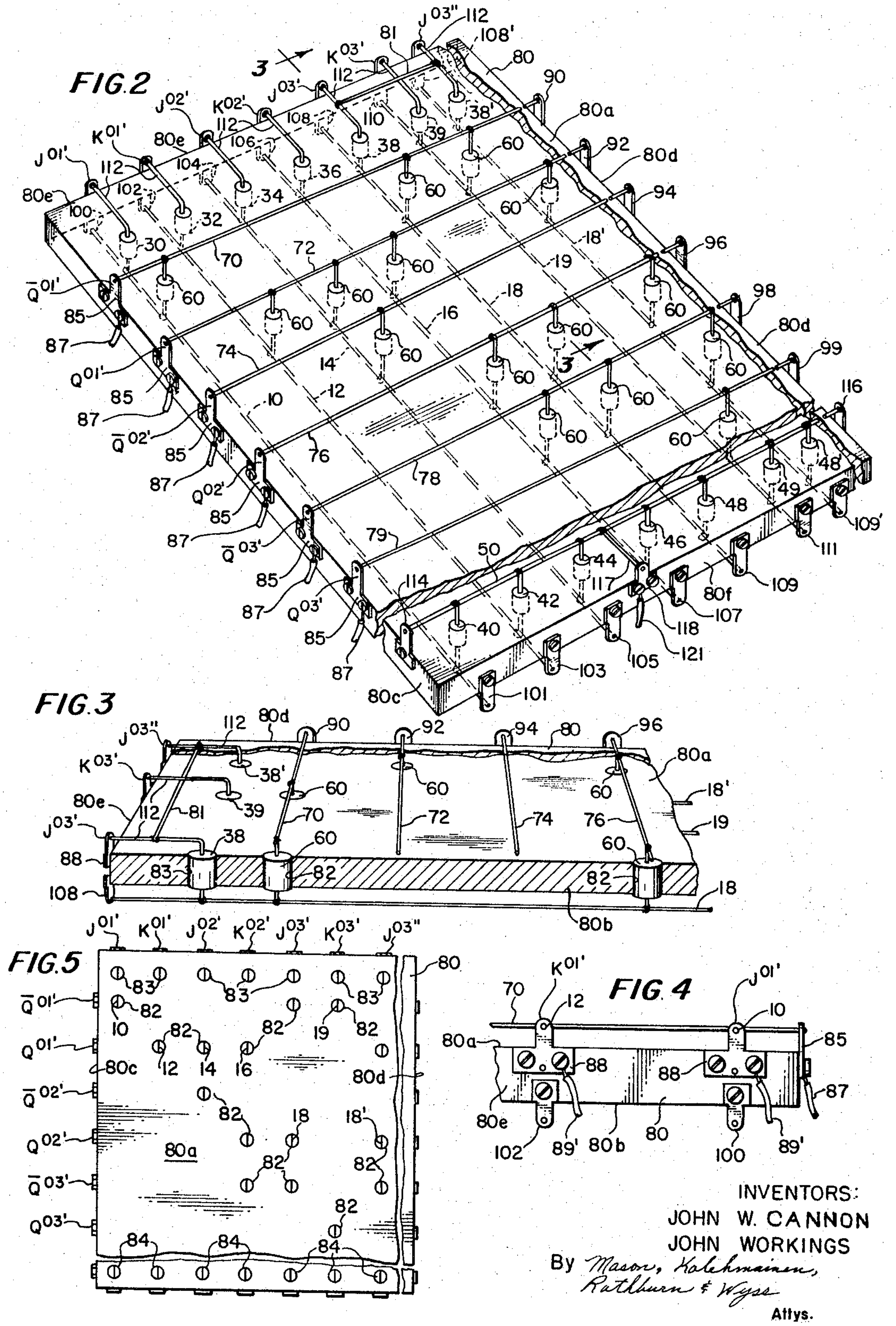
FIG. 2 is a perspective view showing the physical embodiment of that portion of the logic circuit system shown in FIG. 1 enclosed by dashed lines, which physical embodiment illustrates the preferred features of the present invention.
FIG. 3 is an enlarged fragmentary perspective view in partial section of the apparatus of FIG. 2, taken substantially along the section line 3—3 thereof.
FIG. 4 is a fragmentary, enlarged rear view of the apparatus of FIG. 2.
FIG. 5 is a plan view of the insulating board forming part of the apparatus shown in FIGS. 2 and 3 before the rectifiers and resistors have been mounted therein.

Refer now more particularly to FIGS. 2 through 5. As there shown, a rectangular insulating board 80 forms the main support for all of the elements making up the basic logic circuit system. The board has a series of selectively positioned holes 82 in which are nestled the logic circuit forming rectifiers 60, a series of holes 83 in which are nestled the isolating rectifiers 30, 32, etc. and a series of holes 84 in which are nestled the resistors 40, 42, etc. (FIGS. 3 and 5). The rectifiers and resistors are shown in the form of cylinders conforming to the size and shape of the holes 82, 83 and 84. Each component has a pair of leads extending transversely beyond the outer surfaces **80*a* and 80*b*** of the insulating board.

The signal input terminals $\bar{Q}^{01'}$, $Q^{01'}$, $\bar{Q}^{02'}$, etc. are carried by respective terminal strips 85 connected along one of the edges **80*c* of the board. The signal input terminals extend beyond the surfaces 80*a* of the insulating board. The terminal strips may have screw terminals or the like for removably receiving conductors 87 extending to the bistable circuit outputs. Binding posts 90, 92, 94, 96, 98 and 99 are preferably positioned on or along the opposite edge 80*d* of the insulating board at points directly opposite the signal input terminals $\bar{Q}^{01'}$, $Q^{01'}$, etc., the binding posts projecting beyond the surface 80*a* of the insulating board 80. The signal input lines 70, 72, 74, etc. in FIG. 1 are busses preferably in the form of conductive wires tautly stretched and anchored between the corresponding signal input terminals $\bar{Q}^{01'}$, $Q^{01'}$, $\bar{Q}^{02'}$, etc. and the binding posts 90, 92, 94, etc. in spaced relation to the board surface 80*a*. The signal input wires extend transversely of the edges 80*c* and 80*d* of the board approximately in a plane including the ends of the leads 60*a* of the rectifiers 60**.

The signal output terminals $J^{01\prime}$, $K^{01\prime}$, $J^{02\prime}$, $K^{02\prime}$, etc. are most advantageously carried by terminal strips 88 (FIG. 4) similar to the terminal strips 85 and preferably positioned on or along the edge 80*e* of the board which is transverse to the board edges 80*c* and 80*d*. The terminals project beyond the surface 80*a* of the insulating board 80. Each terminal strip 88 has a screw terminal (FIG. 4) for removably connecting external conductors 89' to the signal output terminals. Pairs of binding posts 100–101, 102–103, 104–105, 106–107, 108–109, 108'–109' and 110–111 are respectively preferably positioned on or along the opposite board edges 80*e* and 80*f* of the board in registry or alignment with the terminal strips 88 and project beyond the insulating board surface 80*b*. The signal output lines 10, 12, 14, 16, 18, 18' and 19 are conductive busses preferably in the form of wires tautly stretched and preferably positioned on or along the pairs of binding posts 100–101, 102–103, 104–105, 106–107, 108–109, 108'–109' and 110–111 in spaced relation to the board surface 80*b* in approximately the plane of the ends of the lead wires 60*b* of the rectifiers 60. Thus, the signal output wires extend at right angles to the signal input wires on the opposite side of the insulating board therefrom.

The signal input and output wires cross one another when viewed in superimposed relation and the projection of these points upon the insulated board locates rows and columns of component-receiving positions on the board. The board will not utilize all of these component-receiving positions, the actual number and position of the used positions being dependent upon the particular "and" circuit logic involved. The holes 82 which hold the logic circuits forming rectifiers 60 may be drilled in the board using a master template with correspondingly positioned holes. As best seen in FIG. 5, the circuit board will actually resemble the rectangular grid circuit diagram of the logic circuit involved like that shown in FIG. 1, with a hole 82 located at each crossover point of the signal input and output lines having a rectifier 60 connected therebetween.

The isolating rectifier-receiving holes 83 are most advantageously formed in the insulating board at points contiguous to the signal output terminals $J^{01\prime}$, $K^{01\prime}$, $J^{02\prime}$, $K^{02\prime}$, etc. and in alignment with the associated signal output wires 10, 12, 14, etc. The resistor-receiving holes 84 are positioned on the opposite side of the insulating board 80 from the latter rectifier-receiving holes 83 contiguous to and in alignment with the binding posts 101, 103, etc.

The common power bus 50 comprises a conductive wire 50 stretched between a pair of binding posts 114–116 connected to the opposite edges 80*c* and 80*d* of the board 80 in alignment with the resistor-receiving holes 84 and projecting beyond the board surface 80*a*. A jumper 117 connects the power bus 50 to the binding post of a terminal strip 118 connected to the board edge 80*f*. The terminal strip 118 has a screw terminal for removably receiving a conductor 121 extending to the source of direct current voltage 54.

Since the leads of the circuit forming rectifiers, the isolating rectifiers and the resistors of the logic circuit system extend contiguous to the signal input and output wires, it is a simple matter to solder or preferably weld the ends of the leads to the signal input and output wires with which they are contiguous. The circuit board of the invention can be made by unskilled persons with little knowledge of the circuitry since the design of the insulating board 80 with the selectively positioned holes therein will automatically determine the position of the rectifiers and their connections to the signal input and output wires. FIG. 5 is intended to show the condition of the insulating board 80 just before receiving the various rectifiers and resistors and where the board is held by a suitable fixture (not shown) in a horizontal position. As there shown, the signal output wires 10, 12, 14, 16, 18, 18' and 19 are in place beneath the board, but the signal input wires have not yet been mounted on the board. The rectifiers and resistors can then be dropped into their respective holes 82, 83 and 84 to the bottom leads 30*b*, 40*b* and 60*b* thereof and will come to rest against the top surfaces of the signal output wires and common power bus which pass in alignment with the center portions of these holes. Then, the signal input wires are mounted above the insulating board as described and the contiguous wires and leads are most advantageously welded together. Jumpers 112 are welded between the upper leads 30*a* of the isolating rectifiers and the signal input terminals $J^{01\prime}$, $K^{01\prime}$, etc. (see FIG. 3).

Thus, when all of the resistors and rectifiers are mounted in their holes with their leads welded to their associated wires, the logic circuit is completed except for the external connections referred to of the various input and output terminals of the insulating board 80.

The physical construction of the "and" logic circuit board of the invention is such that the nature of the logic circuits involved is immediately apparent. This permits the board to be fabricated and repaired by relatively unskilled workers who do not need to interpret the circuitry involved. The present invention also requires much fewer component connections than conventional methods of making logic circuit systems. Since the signal input and output lines comprise wires or busses spaced from the opposite surfaces of the board 80 and are remote from the bodies of the rectifiers and resistors involved, the heat generated by a welding operation will not damage the board 80 or the resistors and rectifiers supported in the holes thereof. Perhaps the most important advantage of the invention is the extremely high packing densities which can be effected by the present invention which, in many instances, has increased packing densities by a factor of six to one over "and" logic circuit apparatus made by fabrication techniques heretofore used.

It should be understood that numerous modifications may be made in the most preferred form of the invention described above without deviating from the broader aspects of the invention.

What we claim as new and desire to protect by Letters Patent of the United States is:

1. Logic circuit board apparatus for providing a predetermined output signal in response to the application of a selected input signal from one of a group of signal sources, comprising in combination:

a board formed of insulating material;

a series of input busses suspended in parallel, spaced relation over a first surface of the board, each of said busses adapted to be connected to a signal source;

a series of output busses suspended in parallel, spaced relation over the second surface of the board and transversely of said input busses;

a power supply bus suspended over said first surface of the board and transversely of said output busses;

a first group of holes in said board, one at each crossing point of said power supply bus and one of said output busses;

a resistor in each of said first group of holes connected between the respective output bus and said power supply bus for normally applying a first potential to each output bus;

a second group of holes in said board at selected crossing points of said input and output busses;

and logic diodes in said second group of holes and connected between said input and output busses at said selected crossing points for coupling an input signal applied to one input bus to at least one of said output busses thereby to change the potential of selected ones of said output busses.

2. Logic circuit board apparatus as claimed in claim 1 further comprising a plurality of binding posts supported by the board and extending above the first and second surfaces of the board, said input and output busses comprising wires extending between opposed binding posts.

3. The logic circuit board apparatus of claim 1 further comprising:

a group of output terminals supported on said first surface of the board;

a third group of holes in the board, one adjacent each output terminal;

and an isolating diode in each of said third group of holes interconnecting each output terminal with one of said output busses.

4. The logic circuit board apparatus of claim 3, further comprising:

a group of input terminals carried by the board, each connected to one of said input busses.

5. Logic circuit board apparatus as claimed in claim 4 wherein said resistors, said blocking diodes and said logic diodes include wire leads welded into position.

References Cited

UNITED STATES PATENTS

| | | | |
|---|---|---|---|
| 2,590,950 | 4/1952 | Eckert et al. | 340—166 |
| 2,749,484 | 6/1956 | Levitt | 340—166 X |
| 2,898,483 | 8/1959 | Muller. | |
| 2,943,312 | 6/1960 | Von Kummer. | |
| 3,061,816 | 10/1962 | Reynolds | 317—99 |
| 3,248,711 | 4/1966 | Lewin | 340—166 |

FOREIGN PATENTS

| | | |
|---|---|---|
| 569,329 | 7/1958 | Belgium. |

JOHN W. CALDWELL, *Primary Examiner.*

NEIL C. READ, *Examiner.*

H. I. PITTS, *Assistant Examiner.*